United States Patent [19]

Steele

[11] Patent Number: 4,547,767
[45] Date of Patent: Oct. 15, 1985

[54] PRINTED CIRCUIT BOARD FOR ACTIVATING AND DEACTIVATING ALARM SYSTEMS

[75] Inventor: David C. Steele, Granite Falls, N.C.
[73] Assignee: Moose Products, Inc., Hickory, N.C.
[21] Appl. No.: 540,331
[22] Filed: Oct. 11, 1983
[51] Int. Cl.[4] .................. G08B 23/00; H05K 1/00
[52] U.S. Cl. .................. 340/500; 340/348; 340/543; 339/17 LC; 339/18 B; 361/172
[58] Field of Search .......... 340/500, 534, 535, 508, 340/523, 542, 543, 825.22, 825.44, 825.5, 825.51, 825.75, 825.83, 825.84, 348, 349–355; 200/42 R, 43, 45; 339/18 P, 18 R, 18 B, 18 C, 17 R, 17 C, 17 LC, 19; 361/171, 172

[56] References Cited

U.S. PATENT DOCUMENTS

| | | | |
|---|---|---|---|
| 3,486,160 | 12/1969 | Wallace, Jr. | 339/18 C |
| 3,518,612 | 6/1970 | Dunman et al. | 339/17 LC |
| 3,600,528 | 8/1971 | Leposavlc | 200/5 |
| 3,609,738 | 9/1971 | Marte | 340/543 |
| 3,805,246 | 4/1974 | Colucci et al. | 361/172 |
| 4,232,291 | 11/1980 | Bernier | 340/543 |
| 4,430,524 | 2/1984 | Santucci | 339/19 |

Primary Examiner—Donnie L. Crosland
Attorney, Agent, or Firm—Roy B. Moffitt

[57] ABSTRACT

A printed circuit board including a dielectric material having first and second major surfaces, a predetermined number of electrical conductors attached to the major surfaces, a plurality of slots in the board, the slots beginning at the free edge of the board and continuing inwardly for a predetermined length, a portion of the electrical conductors lying parallel and adjacent to a portion of the longitudinal axis of the slots on both of the major surfaces, and a "U" shaped current carrying connector inserted into one of the slots the terminal free edges thereof in mechanical engagement with a preselected conductor of the first surface and a preselected conductor of the second surface forming an electrical path there between.

5 Claims, 5 Drawing Figures

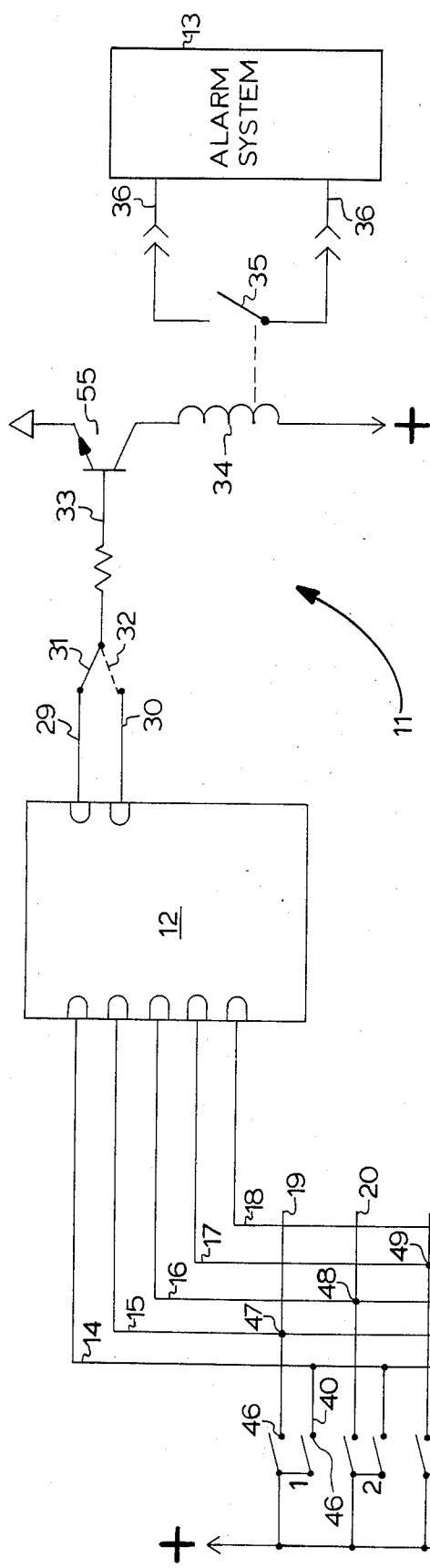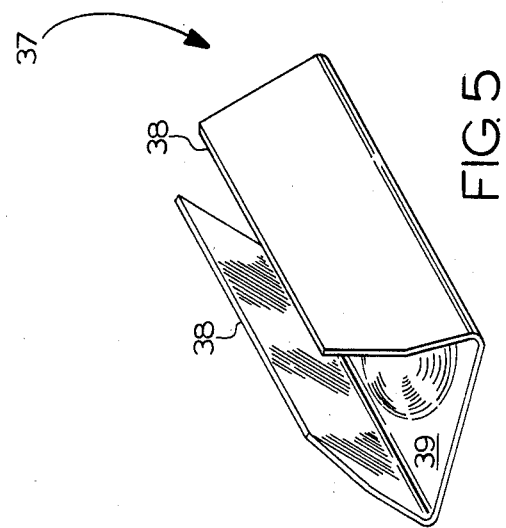
FIG. 1
FIG. 5

PRINTED CIRCUIT BOARD FOR ACTIVATING AND DEACTIVATING ALARM SYSTEMS

BACKGROUND OF THE INVENTION

The present invention deals with a circuit, more particularly with a printed circuit board, useful for activating and deactivating an alarm system and includes a push-button "touch tone" set of switches and a logic means responsive to a predetermined sequence of voltage pulses arising out of the opening and closing of the switches (push buttons) in a predetermined sequence. More particularly, the printed circuit board includes an unique structure that permits the predetermined sequence, demanded by the logic means before it will emit a pulse that is designed to either activate or deactive an alarm system, to be quickly put into an arbitary code merely by manually repositioning "U" shaped metal clips in certain slots in the terminal margin of the printed circuit board. Using the disclosed circuit, any given printed circuit board so constructed can be coded and recoded a multiplicity of times without even having to change or replace the logic means, notwithstanding the fact that the logic means is only responsive to a given or set predetermined sequence of pulses.

BRIEF DESCRIPTION OF THE INVENTION

The basic problem addressed and solved by the present invention is one that deals with the encoding of a circuit that employs a logic means, responsive only to a predetermined threshold sequence of pulses of electrical potential in combination with a push-button type means for creating the desired pulses. A conventional push-button key board contains buttons labeled with Arabic numerals 1, 2, 3, 4, 5, 6, 7, 8, 9 and 0 plus two extra buttons usually labeled # and *: 12 push buttons in the aggregate. Using such buttons, which are simply normally opened switches connected to a potential source of electrical energy, a multiplicity of codes can be created, e.g., 1, 2, 3, 4; 0, 9, 8, 7; 4, 3, 2, 1; etc. Any combination of the Arabic numerals 1–0 and/or the symbols previously identified can be used. So long as the sequence selected matches the threshold sequence demanded by the logic means (the one it is preset to be responsive to), the logic means can be made to emit a pulse to activate or deactivate an alarm system.

The problem arises, however, when a logic means has a predetermined threshold sequence of say 1, 2, 3, 4 and one wants to "change the code" from the striking of buttons 1, 2, 3 and 4 in that order to other buttons in an entirely arbitrary order, for example, 4, 3, 2, 1, yet such arbitrary order still will be adapted to send to the logic means the desired predetermined threshold sequence of electrical impulses. Obviously such could be done by replacing the logic means with one that would "fit" the newly chosen arbitrary code (4, 3, 2, 1). Such is expensive and makes for a "rigid" system. This problem is solved by the present invention by a very simple expedient, namely a novel printed circuit board design.

The novel printed circuit board design of the present invention includes the conventional dielectric board onto which both major surfaces are "printed" electrical conductors in combination with other electronic devices such as resistors, diodes, logic means, transistors, etc. Slots are cut into the terminal margin of the board, beginning at the free edge thereof and continuing inwardly for a predetermined length. A portion of the electrical conductors lie parallel and adjacent to the longitudinal axis of the slots on both major surfaces. Removable "U" shaped connectors, adapted to conduct electric current, are inserted in a predetermined order into the slots, their terminal free edges being in mechanical engagement with a preselected conductor of the first surface and a preselected conductor of the second surface forming an electrical path there between.

A printed circuit board of the basic structure described above is employed to form a circuit for the versatile encoding of an alarm system. This circuit comprises two or more (usually 10) normally opened switches (push-button type switches), which are adapted to be connected to a source of electrical potential. Each switch has two contacts and two leads (first and second leads) associated therewith, one set of terminal portions of the leads being adapted to be placed in electrical communication with associated switch contacts upon closure of the switch to permit a pulse of electrical potential to flow there through. Other leads (four in number when ten switches are used), third, fourth, fifth and sixth leads, are connected to a logic means, responsive to emit a predetermined output upon receipt of a predetermined sequence of electrical potential pulses over such leads as a result of closing the switches (depressing the push buttons) in the predetermined sequence demanded by the logic means. The first lead of each switch is on one major surface of the printed circuit board, parallel to and adjacent to a slot and the third, fourth, fifth and sixth leads are on the opposite side, also parallel and adjacent to a slot. "U" shaped connectors are used to "code" the sequence desired. For example, but not by way of limitation, if the logic means will only "accept" (is responsive to) the sequence 1, 2, 3, 4, the first lead of switch is connected to the third lead, the first lead of switch 2 is connected to lead 4, etc. by means of the "U" shaped metal clamps. Whatever the case, assuming that the logic means will only accept pulses first appearing on lead 3, then on lead 4, etc., the first lead associated with the first switch in any desired code combination is connected to lead 3 and the second number in the desired code is connected to the lead 4, etc. Two additional leads (8 and 9) would be necessary for # and * switches. Of course, if the logic means were of such a nature that it would only accept sequences that were in the reverse, i.e., 6, 5, 4, 3, then the first lead of the switch 6, would be connected to the lead 3, 5 to lead 4, 4 to lead 5 and 3 to lead 6. Such coding and recoding can obviously be easily achieved by removing the metals clips from one configuration and inserting them in slots to create another combination as desired.

Alarm systems, such as burglar alarms, conventionally are of two types with respect to their being activated and deactivated: latching and momentary. A latching alarm system is one that can be activated (turned on) by a given signal or act and it stays "ON" until it is deactivated (turned off) by the same given signal or the reverse of an act. An example of an act would be the turning of a key to an on position to activate and then reversing the act (turning the key back to its original position) to deactivate. A momentary alarm system usually is one that is responsive to a given signal regardless of the state (deactivated or activated) the system is in at the instant it receives a predetermined signal. If the alarm is activated (in the "ON" state), receipt of a predetermined signal will deactivate the system. If the system is in the deactivated state (in the "OFF" state), receipt of the predetermined signal will activate the alarm system.

BRIEF DESCRIPTION OF THE DRAWING

FIG. 1 is a schematic representation of a circuit used to activate and deactivate an alarm system.

FIG. 5 is a perspective view of element 37 of FIGS. 2, 3 and 4.

DETAILED DESCRIPTION OF THE INVENTION

Figure 2:
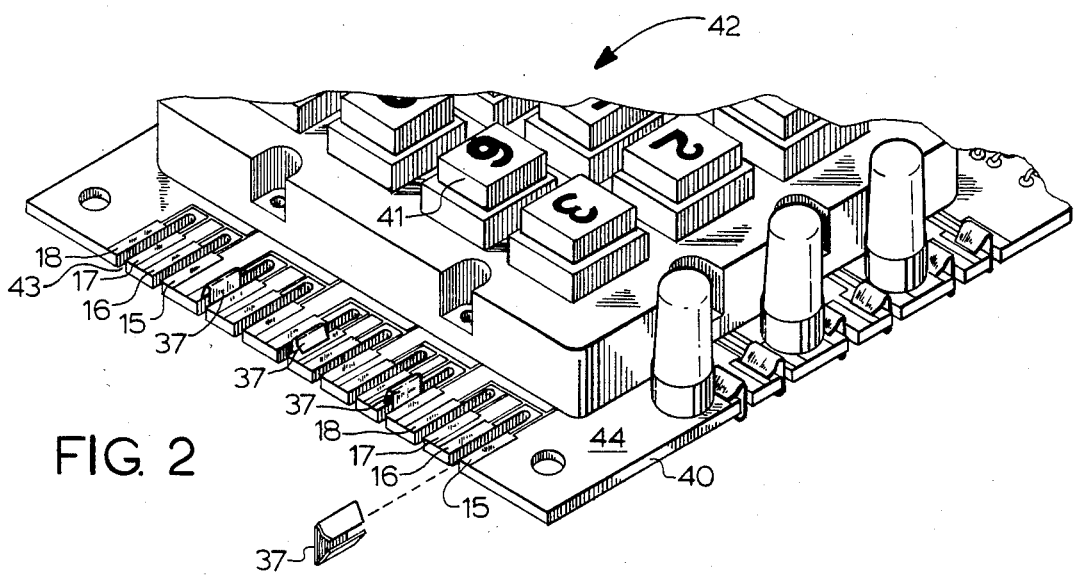
FIG. 2 is a fragmentary perspective view of a printed circuit board of the present invention.

Element 11 of FIG. 1 is a simplified schematic of a circuit adapted to be encoded so that it will either activate or deactivate an alarm system. Circuit 11 is made up primarily of switches 1, 2, 3, 4, 5, 6, 7, 8, 9 and 0 electrically connected to a source of electrical potential (+) and adapted to be electrically connected to logic means 12 upon selected switch closure. Logic means 12 is adapted to be electrically connected through connector 31 or to alarm means 13. The aforementioned switches, namely 1 through 0 are conventional and well known "push buttons" familiar to most people as a result of their appearing on a great number of telephones. See for example element 41 of FIGS. 2 and 3. These switches are normally opened, i.e., they are biased opened and upon applying finger tip pressure they may be closed, i.e., the biased open portion of switch 1 may be pressed downward to come in contact with contacts 46 thereby providing a path permitting an electrical potential to exist on lead 19, common 14 and lead 15, assuming lead 15 is connected to lead 19 as hereafter described, and thus to logic means 12. Since logic means 12 is preprogrammed to be responsive to a given series of pulses, namely a given sequence, upon receiving that sequence, it emits a predetermined pulse, that pulse travels over leads 29 and 30. Depending on the position of switch/connector 31 or 32, as the case may be, more fully explained hereafter, this pulse travels along lead 33 turning on transistor 55 activating relay 34, which closes switch 35 and over lead 36 to alarm systems 13 thereby activating same. In circuit 11, lead 19 is connected to lead 15 at point 47 by connector 37, lead 20 connected to lead 16 at point 48 by connector 37; lead 21 to lead 17 at point 49 by connector 37; and, lead 22 to lead 18 at point 50 by connector 37. Connected in this manner, one striking (closing) switches 1, 2, 3, 4 in that order will send electrical potential pulses to logic means 12 in that order. Assuming logic means 12 is programmed to be responsive to such 1, 2, 3, 4 sequential order, it will respond to activate or deactivate as the case may be alarm means 13 by causing switch 35 closure or opening. Assuming that switches 1, 2, 3 and 4 were disconnected, i.e., connectors 37 were removed from points 47–50 and connectors 37 were used to connect lead 23 to lead 15 at point 51; lead 24 to lead 16 at point 52; lead 25 to lead 17 at point 53 and lead 26 to lead 18 at point 54, then keys 5, 6, 7 and 8 would have to be closed, in that order, so as to present the "1, 2, 3, 4" sequence of desired pulses to logic means 12 to which it is predeterminedly responsive. Obviously, various combinations of key strikes can be devised, all sending the desired pulses. Connector 37, made of any suitable metal that will conduct electrical current, is generally "U" shaped in cross section, having legs 38 connected together by integral cross member 39. The terminal free edges of legs 38 are positioned so that they will mechanically engage and frictionally hold on to a set of chosen leads as to form an electrical path there between.

Each switch has a common 14 lead and an additional dedicated lead associated therewith, e.g., lead 19 for switch 1; lead 20 for switch 2, lead 21 for switch 3, lead 22 for switch 4, lead 23 for switch 5, lead 24 for switch 6, lead 25 for switch 7, lead 26 for switch 8, lead 27 for switch 9 lead 28 for switch 0. Leads 19 through 28 are spaced apart from leads 14, 15, 16, 17 and 18. Leads 19 through 28 are on one side (element 45) of dielectric 40 of a printed circuit board 42 and leads 15 through 18 are on the other side (44) of dielectric 40 of printed circuit board 42. In FIG. 2, element 41 is a push button that closes switch 6 in a well known manner. This switch and all of the other switches are mounted on printed circuit board 42 along with circuit 11. Leads 19 through 28 are on side 45 of dielectric 40 and leads 14 through 18 are on the opposite side (44) of dielectric 40, thus being spaced apart and insulated from each other.

Figure 3:
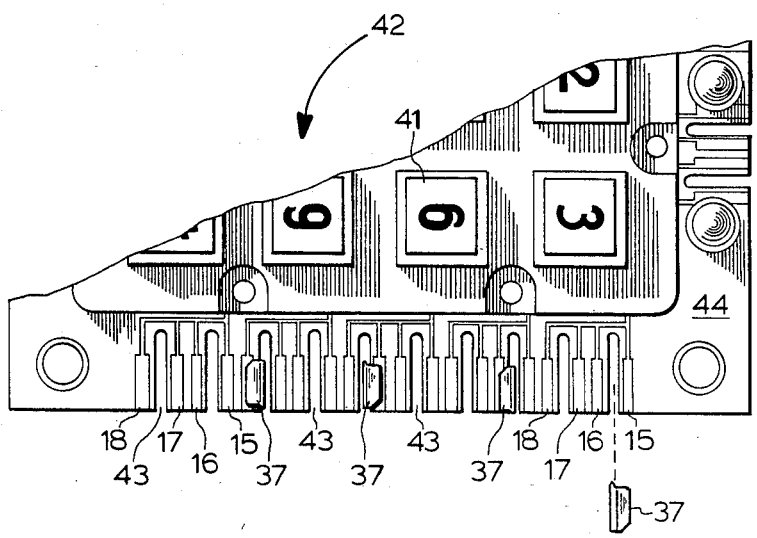
FIG. 3 is a fragmentary plan view of one of the major surfaces of the printed circuit board of FIG. 2.
Figure 4:
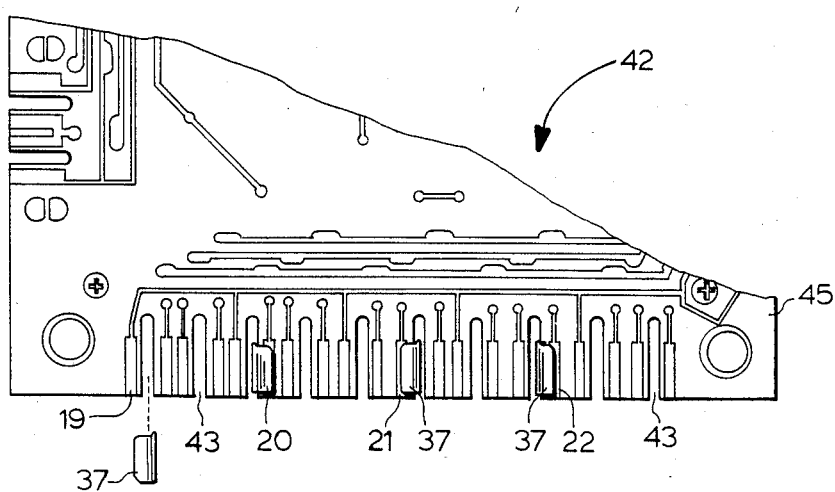
FIG. 4 is a fragmentary plan view of the opposite major surface of the printed circuit board of FIG. 3.

Viewing FIGS. 2, 3 and 4, it will be noted that at least ten groups (one for each switch) each comprising leads 15, 16, 17 and 18 terminate on surface 44 of dielectric 40 at or near one of its free edges. In between each pair of leads 15–16 and 17–18, there are slots 43 into which connectors 37 are adapted to slideably fit, the terminal free edges 38 of which mechanically gripping and forming an electrical path with another lead on the reverse side of dielectric 40. Since leads 19 through 28 are aligned with each group of leads 15 through 18, any desired combinations of connections between these leads can be made simply by inserting connector 37 into the desired slot 43. A sequence of 1, 2, 3, 4 (switch closures) has been previously disclosed assuming a logic means responsive to such sequence. This sequence is achieved by using connectors 37 as shown in FIGS. 2, 3 and 4 to represent connections at points 47, 48, 49 and 50 fitting the "1," "2," "3," "4" sequence.

Switch-connectors 31–32 are for latching or momentary type alarms and can be either a switch or a set of leads connected together by a connector like that of element 37 as desired. By using connectors 37, the printed circuit board is applicable for either a latching or momentary mode type alarm system merely by inserting connector in the desired slot to complete either a latching or momentary type alarm.

Although the invention has been described in detail, such detailed description is only for the purpose of illustrating specific embodiments. It is evident that variations and modifications can be made from those described without deprting from the spirit and scope of the invention.

What is claimed is:

1. A dielectric board having two major surfaces and a circuit on each of the surfaces for encoding an alarm means comprising:
   (a) a logic means responsive to emit a predetermined output signal upon receipt of a predetermined sequence of electrical pulses, normally opened first and second switches adapted to be connected to an electrical potential having first and second contacts, and a common lead connecting the first contact of each switch with the logic means;

(b) a first lead for each switch disposed and terminating on one of the major surfaces in electrical communication with the second contact of the switch;

(c) second and third leads connected to the logic means, disposed and terminating on the other major surface of the dielectric board;

(e) a plurality of slots in the dielectric board beginning at the free edge of the board and continuing inwardly for a predetermined length, a terminal portion of the first, second and third leads lying parallel and adjacent to a portion of the longitudinal axis of the slots; and, (f) a first "U-shaped" removable connector means inserted into one of the slots electrically connecting the terminal portion of the first lead of the first switch to either the terminal portion of either the second or the third lead and a second "U-shaped" removable connector means inserted in another slot electrically connecting the terminal portion of the first lead of the second switch to either the terminal portion of either the second or third leads not otherwise engaged by the first "U-shaped" connector.

2. The circuit of claim 1 including an alarm system connected to said logic means, the alarm system containing momentary or latching activating and deactivating means responsive to be activated or deactivated by responding to the predetermined output signal of said logic means.

3. The circuit of claim 2 including a third switch and a relay means disposed between said logic means and alarm system, both the third switch and relay means electrically connected to each other, to the logic means and to the alarm system.

4. The circuit of claim 3 wherein the third switch is a selection switch for either momentary or latching mode type activating or deactivating means.

5. The circuit of claim 4 wherein said third switch is composed of a slot in the dielectric board beginning at the free edge thereof and continuing inwardly for a predetermined length, electrical conductors connected to the logic means and to the third switch being disposed parallel to and adjacent to said slot on one of the major surfaces of the board and electrical conductors connected to the third switch and the alarm system disposed parallel and adjacent to the slot on the other major surface of the board; and, a "U-shaped" connector adapted to conduct electrical current, inserted into the slot, the terminal free edges thereof being in removable mechanical engagement with the electrical conductors connecting the third switch to the alarm system on one of the major surfaces of the board and the electrical conductor from the logic means to the switch on the other major surface of the board.

* * * * *